(12) United States Patent
Chen et al.

(10) Patent No.: US 9,997,636 B2
(45) Date of Patent: Jun. 12, 2018

(54) FABRICATING METHOD OF OPTICAL SENSING DEVICE

(71) Applicant: AU OPTRONICS CORP., Hsin-Chu (TW)

(72) Inventors: Ching-Wen Chen, Hsin-Chu (TW); An-Thung Cho, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/683,031

(22) Filed: Aug. 22, 2017

(65) Prior Publication Data

US 2017/0352764 A1 Dec. 7, 2017

Related U.S. Application Data

(62) Division of application No. 15/158,042, filed on May 18, 2016, now Pat. No. 9,773,914.

(30) Foreign Application Priority Data

Jul. 31, 2015 (TW) .............................. 104125000 A

(51) Int. Cl.

| H01L 21/02 | (2006.01) |
|---|---|
| H01L 29/786 | (2006.01) |
| H01L 27/32 | (2006.01) |
| H01L 27/12 | (2006.01) |
| H01L 21/027 | (2006.01) |
| H01L 31/09 | (2006.01) |

(Continued)

(52) U.S. Cl.
CPC .... *H01L 29/78651* (2013.01); *H01L 21/0274* (2013.01); *H01L 27/124* (2013.01); *H01L 27/3227* (2013.01); *H01L 29/66765* (2013.01); *H01L 31/09* (2013.01); *H01L 31/18* (2013.01)

(58) Field of Classification Search
CPC ... H01L 21/0274; H01L 21/28; H01L 27/124; H01L 27/3227; H01L 27/323; H01L 29/66765; H01L 29/78651; H01L 31/09; H01L 31/18

See application file for complete search history.

(56) References Cited

U.S. PATENT DOCUMENTS 5,627,364 A * 5/1997 Codama ................ H01L 25/167
250/208.1
7,973,311 B2 7/2011 Lujan et al.
(Continued)

FOREIGN PATENT DOCUMENTS

TW I444604 7/2014

*Primary Examiner* — Allan R Wilson
(74) *Attorney, Agent, or Firm* — WPAT, PC

(57) ABSTRACT

An optical sensing device includes a thin film transistor disposed on a substrate, an optical sensor, a planar layer, and an organic light emitting diode. The optical sensor includes a metal electrode disposed on a gate dielectric layer of the thin film transistor and connecting to a drain electrode of the thin film transistor, an optical sensing layer disposed on the metal electrode, and a first transparent electrode disposed on the optical sensing layer. The planar layer covers at least a part of the thin film transistor and the optical sensor. The organic light emitting diode is disposed on the planar layer. The anode electrode and the cathode electrode of the organic light emitting diode are electrically coupled to a gate line and a data line respectively.

4 Claims, 13 Drawing Sheets

(51) Int. Cl.
  *H01L 31/18* (2006.01)
  *H01L 29/66* (2006.01)

(56) References Cited

U.S. PATENT DOCUMENTS

| | | | |
|---|---|---|---|
| 8,283,851 B2* | 10/2012 | Kim | H01L 27/3227 250/214 VT |
| 8,363,028 B2 | 1/2013 | Antaki | |
| 8,772,075 B2 | 7/2014 | Cho et al. | |
| 9,865,661 B2* | 1/2018 | Sato | H01L 27/3227 |
| 2006/0011913 A1* | 1/2006 | Yamazaki | G06F 3/0412 257/59 |
| 2010/0007632 A1 | 1/2010 | Yamazaki | |
| 2010/0053118 A1 | 3/2010 | Chen | |
| 2010/0321341 A1 | 12/2010 | Cho et al. | |
| 2011/0037729 A1 | 2/2011 | Cho et al. | |
| 2014/0036168 A1 | 2/2014 | Ludwig | |
| 2015/0187980 A1* | 7/2015 | Yamamoto | G06F 1/00 250/552 |

* cited by examiner

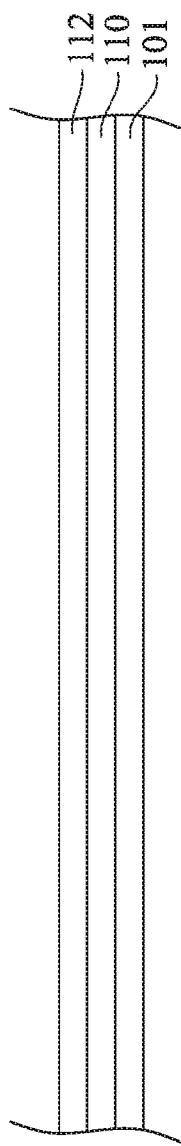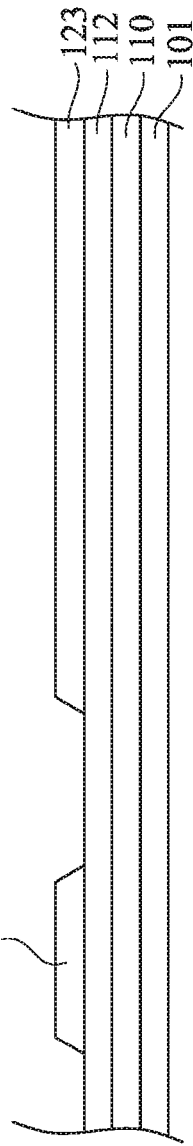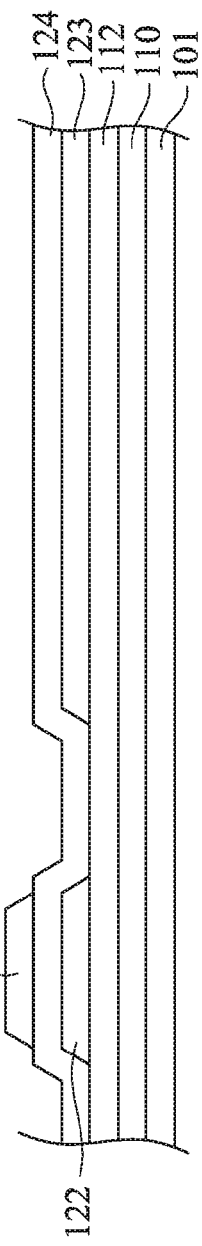

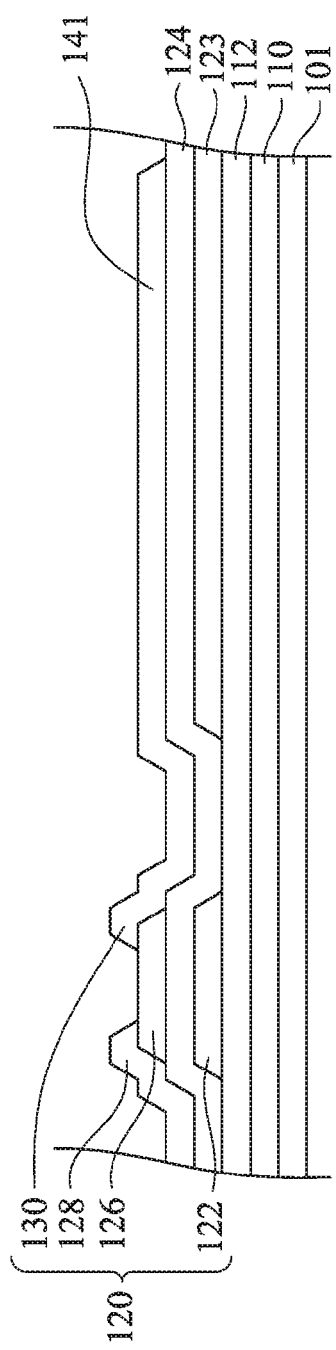
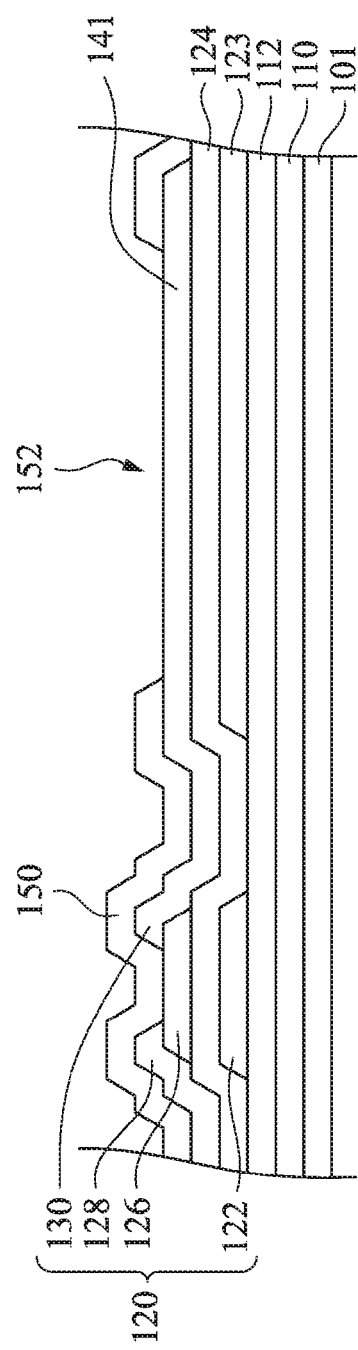

FABRICATING METHOD OF OPTICAL SENSING DEVICE

RELATED APPLICATIONS

The present application is a Divisional Application of the U.S. application Ser. No. 15/158,042, filed May 18, 2016, which claims priority to Taiwan Application Serial Number 104125000, filed Jul. 31, 2015, all of which are herein incorporated by reference.

BACKGROUND

Field of Disclosure

The present disclosure relates to a fabricating method of a fingerprint recognition device. More particularly, the present disclosure relates to a fabricating method of an optical fingerprint recognition device.

Description of Related Art

With the development of science and technology, the input device of electronic products becomes diversified. Among various input devices, in addition to popular keyboard and mouse, touching devices are commonly utilized. Recently, the touching device is integrated into the display panel, so that the display panel is provided with touching function. It is not only to save the space that the input device occupies, but also to let user choose function icon on the screen or input by writing or pointing on the screen. Therefore, the better humanized interface is accomplished.

Owing to the privacy being considered more important, the function of fingerprint recognition becomes popular in user identification of electronic products. For the forgoing reasons, there is a need for simplifying the manufacturing process of the fingerprint recognition module and improving the recognition accuracy thereof.

SUMMARY

One aspect of the disclosure provides a manufacturing method for an optical sensing device. The method includes forming a gate electrode on a substrate, forming a gate dielectric layer on the gate electrode, forming a channel layer on the gate dielectric layer, forming a metal layer on the channel layer and patterning the metal layer so that the metal layer forms a source electrode, a drain electrode and a first metal electrode. The source electrode and the drain electrode are located on the opposite sides of the channel layer. The first metal electrode is connected to the drain electrode. The gate electrode, the gate dielectric layer, the channel layer, the source electrode and the drain electrode collectively form a thin film transistor. The method further includes forming an optical sensing layer on the first metal electrode, forming a first transparent layer on the optical sensing layer, forming a planar layer covering at least portion of the thin film transistor and the first transparent layer, and forming an organic light emitting diode on the planar layer. The method to form the organic light emitting diode includes forming a second metal electrode on the planar layer, forming an organic electroluminescent layer on the second metal electrode, and forming a second transparent layer on the organic electroluminescent layer.

This disclosure provides an optical sensing device which utilizes an organic light emitting diode as a light source. When a finger puts on the optical sensing device, the light reflected by the finger and received by the optical sensor is transformed into a light current. The light current is detected by the thin film transistor respectively. Because the second metal electrode of the organic light emitting diode may provide the shade function to the channel layer, the process for fabricating the shading component may be omitted. Meanwhile, the photosensitive area of the optical sensing device is increased.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 4A to FIG. 4K are schematic cross-sectional views of the optical sensing device in different manufacturing stages according to some embodiments of this disclosure;

DESCRIPTION OF THE EMBODIMENTS

Figure 1:
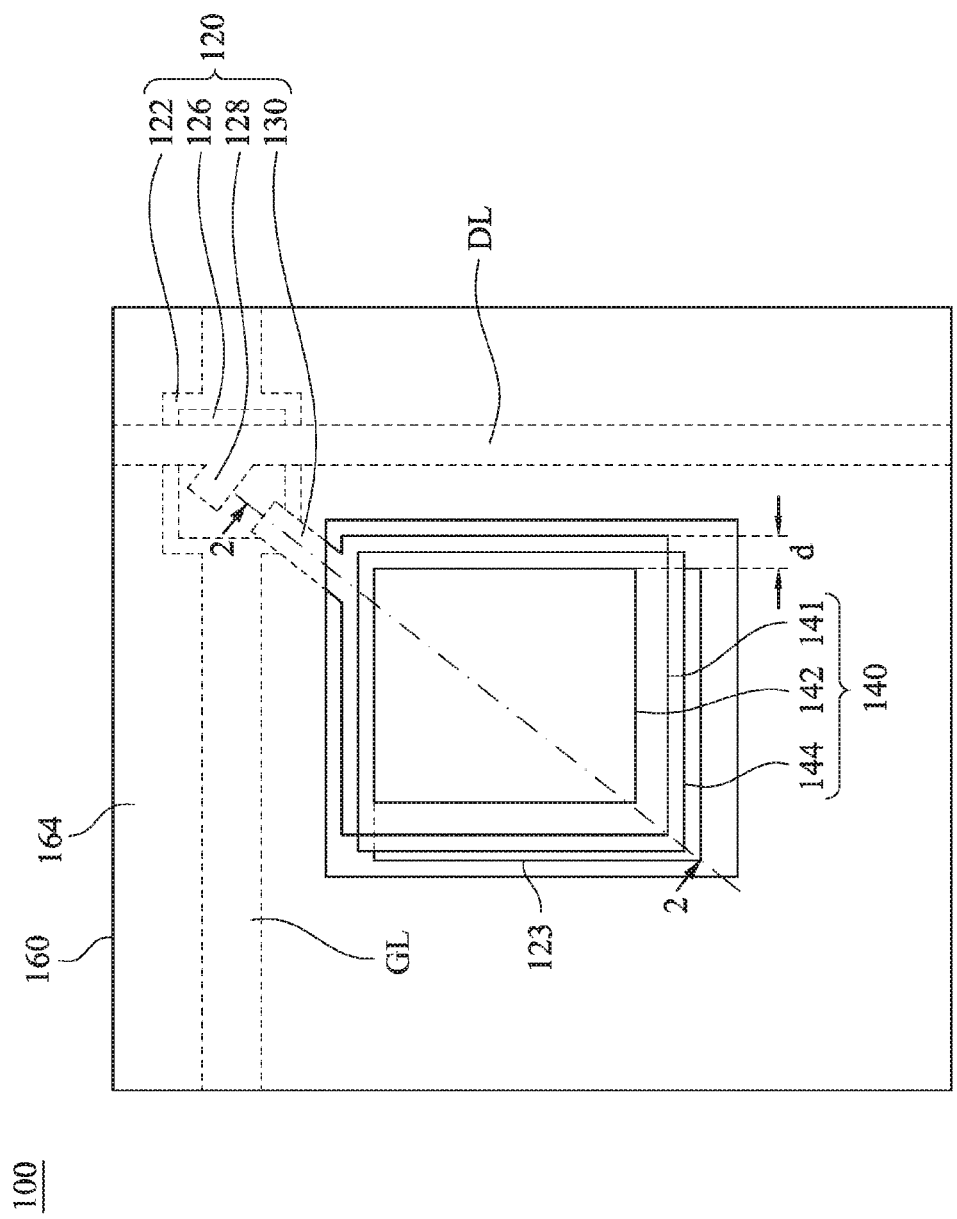
FIG. 1 is a schematic partial top view of the optical sensing device according to some embodiments of this disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
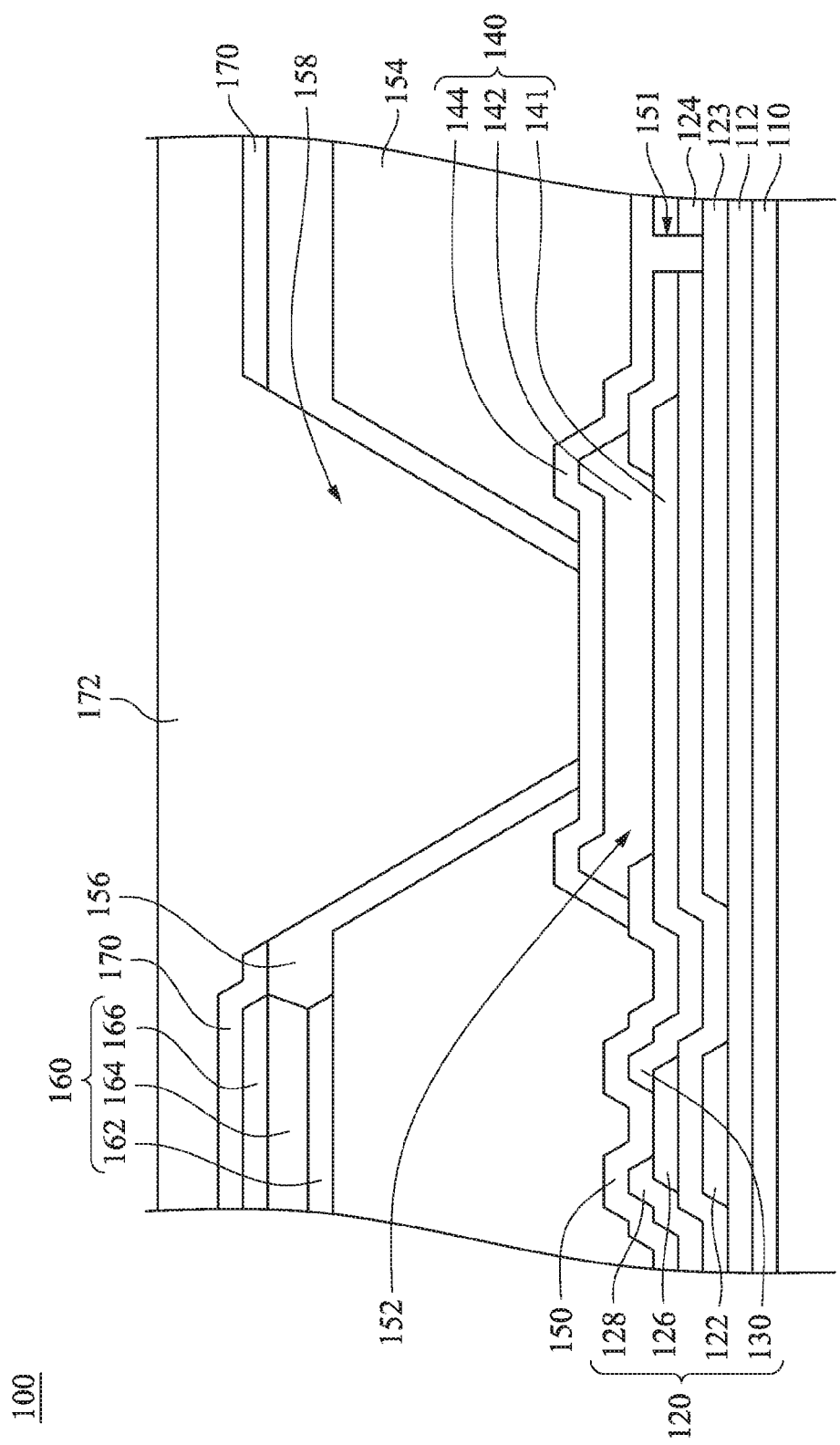
FIG. 2 is a schematic cross-sectional view along the section line 2-2 in FIG. 1.

Referring to FIG. 1 and FIG. 2, FIG. 1 is a schematic partial top view of an optical sensing device according to one embodiment of this disclosure and FIG. 2 is a schematic cross-sectional view along the section line 2-2 in FIG. 1. The optical sensing device 100 includes a substrate 110, at least one thin film transistor 120 on the substrate, at least one optical sensor 140 and at least one organic light emitting diode 160.

It should be noted that, although a single optical sensing device, that is one thin film transistor 120, one optical sensor 140 and one organic light emitting diode 160, is illustrated in FIG. 1 and FIG. 2, plural optical sensing devices may be defined by multiple gate lines GL and multiple data lines DL on the substrate 110 in practice. Each of the optical sensing devices 100 includes one thin film transistor 120, one optical sensor 140 and one organic light emitting diode 160. The optical sensing devices 100 may be disposed in a matrix on the substrate 110.

The optical sensing device 100 utilizes the organic light emitting diode 160 as the light source. When a finger puts on the optical sensing device 100, the light emitted by the organic light emitting diode 160 is reflected by the finger and received by the optical sensor 140. Then, the light is transformed into a light current so that the light current is detected by the thin film transistor 120.

The thin film transistor 120 is disposed on the substrate 110. The thin film transistor 120 includes a gate electrode 122 on the substrate 110, a channel layer 126 on the gate electrode 122, a gate dielectric layer 124 between the gate electrode 122 and the channel layer 126, a source electrode 128 and a drain electrode 130. The source electrode 126 and the drain electrode 130 are disposed on the opposite sides of the channel layer 126 respectively.

The optical sensor 140 is disposed on the substrate 110 and at one side of the thin film transistor 120. The optical sensor 140 includes a first metal electrode 141 connected to the drain electrode 130, an optical sensing layer 142 on the first metal electrode 141, and a first transparent electrode 144 on the optical sensing layer 142. In this embodiment, the first metal electrode 141 may be regarded as the extension of the drain electrode 130. In other words, the first metal electrode 141 is connected to the drain electrode 130. Furthermore, the first metal electrode 141 and the drain electrode 130 are made of the same layer and are photolithographed by the same mask and the same process. For example, they are fabricated by patterning one metal layer.

A bottom metal layer 123 which is made of the same layer as the gate electrode 122 is disposed on the substrate 110. For instance, the gate electrode 122 and the bottom metal layer 123 may be fabricated by patterning one metal layer. The gate dielectric layer 124 and the drain electrode 130 (or the first metal electrode 141) are extended over the bottom metal layer 123 and cover it. The optical sensing device 100 further includes a passivation layer 150. The passivation layer 150 covers the thin film transistor 120 and extends over the bottom metal layer 123. The passivation layer 150 has an opening 152 for defining the position of the optical sensing layer 142. The optical sensing layer 142 is formed in the opening 152.

The optical sensing device 100 further includes a planar layer 154 covering the thin film transistor 120 and the optical sensor 140. The planar layer 154 may be an organic planar layer and has a planar surface. Furthermore, the planar layer has an opening 158 to uncover partial top surface of the optical sensing device. The organic light emitting diode 160 is disposed on the planar layer 154. In this embodiment, the organic light emitting diode 160 is disposed substantially around the optical sensor 140 and above the thin film transistor 120 in a plane view or top view, as showed in FIG. 1. The organic light emitting diode 160 includes a second metal electrode 162 on the planar layer 154, an organic electroluminescent layer 164 on the second metal electrode 162, and a second transparent electrode 166 on the organic electroluminescent layer 164.

The organic light emitting diode 160 is passive type. The second metal electrode 162 is utilized as a anode of the organic light emitting diode 160, and the second transparent electrode 166 is utilized as a cathode of the organic light emitting diode 160. The organic electroluminescent layer 164 is disposed between the anode and the cathode. The circuit layout of the organic light emitting diode 160 may be common cathode type or common anode type. In this embodiment, the circuit layout is common cathode type. In other words, when the anode is supplied with electricity, the organic light emitting diode 160 is actuated to emit light. However, in other embodiments, the circuit layout may be common anode type and this disclosure should not be limited to the layout types.

The passivation layer 150 further includes an opening 151. The opening 151 is disposed at one side of the optical sensing layer 142. Further, the optical sensing layer 142 does not overlap the opening 151. The opening 151 penetrates the gate dielectric layer 124 so that the bottom metal layer 123 is exposed on one end of the opening 151. The first transparent layer 144 is extended to the opening 151 and filled in the opening 151. Consequently the first transparent layer 144 is electrically coupled to the bottom metal layer 123 so that they have the same potential. Owing to the first transparent layer 144 and the bottom metal layer 123 have the same potential, a capacitor may be composed of another metal layer and one of them. In one embodiment, one capacitor is composed of the first transparent layer 144 and the first metal electrode 141, and another capacitor is composed of the first metal electrode 141 and the bottom metal layer 123.

The optical sensing device 100 further includes a dielectric layer 156, a barrier layer 170 and a protection layer 172. The dielectric layer 156 is utilized to define the position of the organic light emitting diode 160 and the optical sensor 140. The barrier layer 170 and the protection layer 172 cover the organic light emitting diode 160 and the optical sensor 140. The dielectric layer 156 on the planar layer 154 has the opening 158 on one side of the organic light emitting diode 160 so that the opening 158 uncovers partial top surface of the first transparent electrode 144 thereunder. The barrier layer 170 is disposed on the dielectric layer 156 and has an opening communicating to the opening 158. The barrier layer 170 may be a composite layer composed of multiple inorganic layers and organic layers. The protection layer 172 may be made of transparent inorganic material. The protection layer 172 fully covers the barrier layer 170 and is filled in the opening 158.

Figure 3:
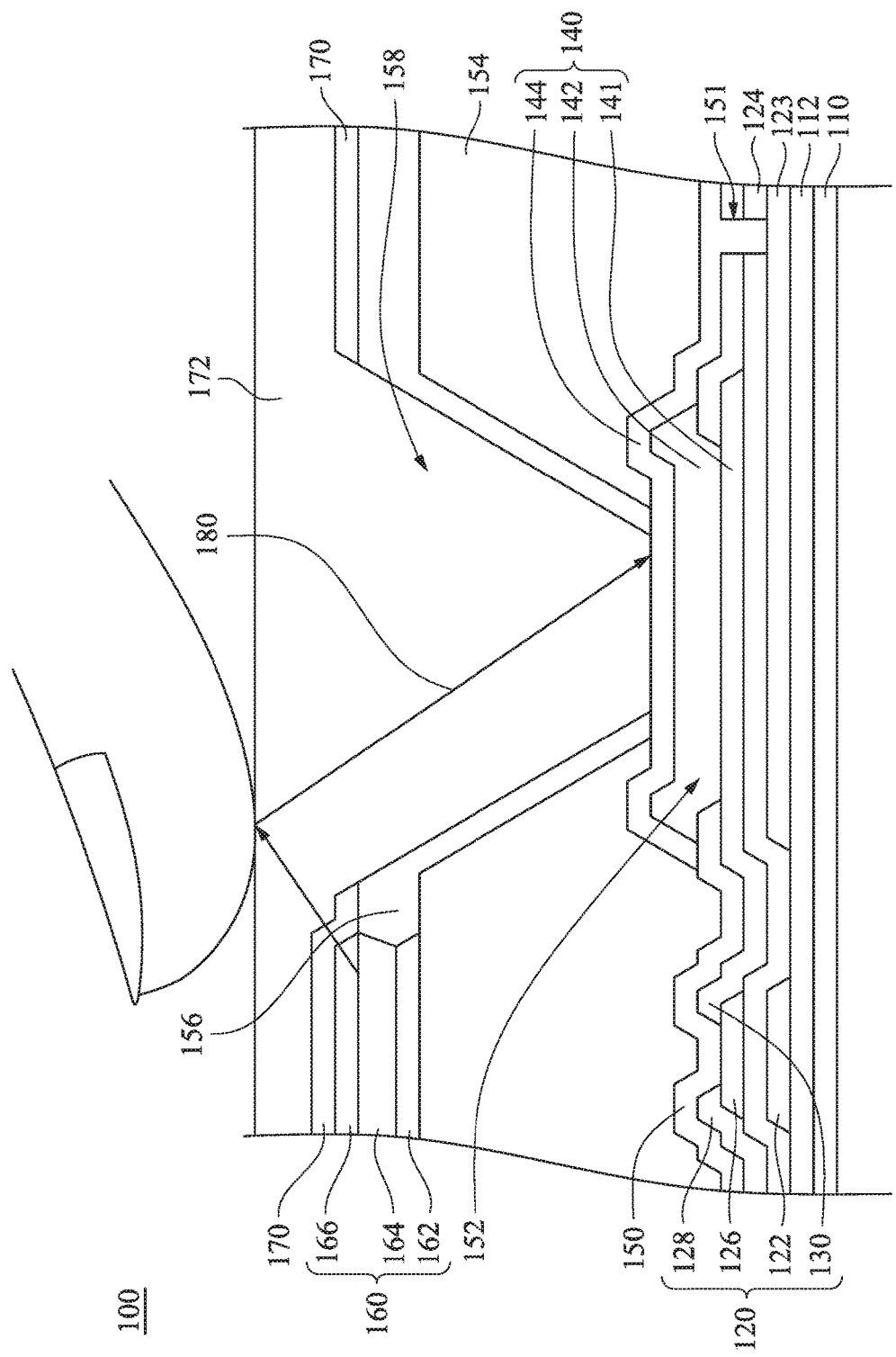
FIG. 3 is a schematic cross-sectional view of the optical sensing device in FIG. 2 showing its operation status.

Referring to FIG. 3, FIG. 3 is a schematic cross-sectional view of the optical sensing device 100 in FIG. 2 showing its operation status. As mentioned above, in this embodiment, the circuit layout of the organic light emitting diode 160 is common cathode type. The current sequentially scans and is provided to the second metal electrode 162 (anode) according to time sequence so that the potential difference between the second metal electrode and the second transparent electrode 166 is generated. Accordingly, the organic electroluminescent layer 164 is actuated to emit light. Because the second metal electrode 162 is anode and the second transparent electrode 166 is cathode, the light 180 of the organic electroluminescent layer 164 is emitted from the anode to the cathode (that is, from the bottom to the top in FIG. 3).

When a finger touches the optical sensing device 100, the light 180 is emitted through the second transparent electrode 166, the barrier layer 170 and the passivation layer 172. Then, the light 180 is reflected by the finger, and enters the optical sensing device 100 again. At least portion of the light 180 may enter the optical sensor 140. After the light 180 enter the optical sensing layer 142, the optical sensing layer 142 is actuated to produce electron-hole pairs. When an external electric field or bias is applied, for example, the first transparent electrode 144 is applied with an external electric field or bias, the electron-hole pairs are separated to form light current flowing to the drain electrode 130 (e.g. the first meta electrode 141).

After the light current is transmitted to the drain electrode 130, the thin film transistor 120 is turned on accordingly. Then the light current may enter the source electrode 128 through the channel layer 126 so that a controller (not shown) may receive the light current. Therefore, the light reflected by the fingerprint may be transformed to a signal as above procedure. A comparator receives the signals so that the fingerprint recognition is performed.

The light is emitted upwardly and the orthogonal project of the second metal electrode is partially overlapped with that of the channel layer on the substrate. Thus, the second metal electrode 162 has the shade function to prevent the channel layer 126 of the thin film transistor 120 from the reflected light 180 and/or an ambient light. Accordingly, the photo-induced current leakage is avoided. Moreover, the process of fabricating the shade component may be omitted so the cost of the process may be saved.

Please refer back to FIG. 1 and FIG. 2. The organic light emitting diode 160 is disposed over the thin film transistor 120 and around the optical sensor 140, thus the light emitted from the organic light emitting diode 160 may not be blocked by the thin film transistor 120 or the optical sensor 140. The organic light emitting diode 160 may not block the detecting area of the optical sensor 140 so that the detecting area is increased. In other words, the orthogonal project of the second metal electrode 162 is substantially complementary to that of the optical sensing layer 142 on the substrate. On the premise that those two projects are not overlapped, this disclosure makes maximum utilization of space.

In some other embodiments, the substrate 110 preferably is a flexible substrate so that the optical sensing device 100 may be deformed according to the profile of the finger. Therefore, the detecting area of the fingerprint may be increased and more feature points of the fingerprint may be detected so that the fingerprint recognition is more precise and the security is improved.

Figure 4F:
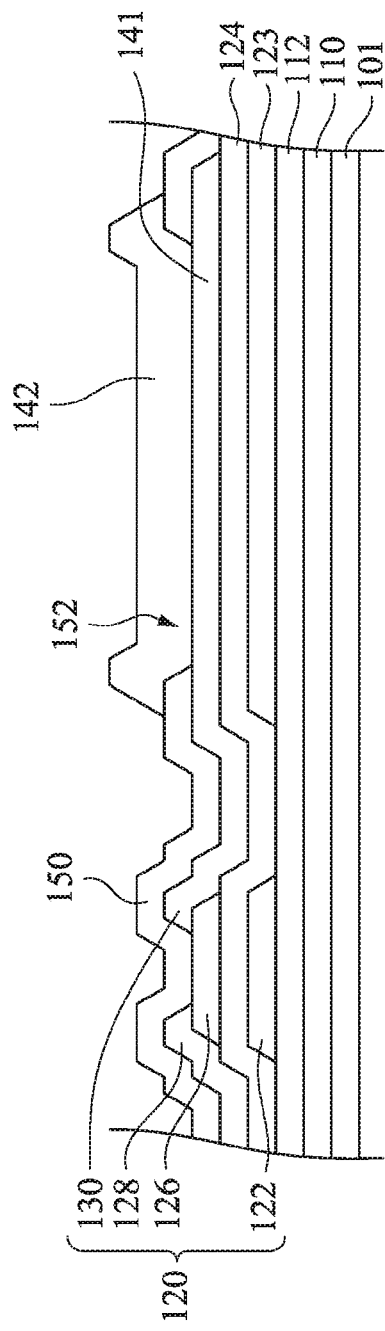

Referring to FIG. 4A to FIG. 4K, FIG. 4A to FIG. 4K are schematic cross-sectional views of the optical sensing device in different manufacturing stages according to one embodiment of this disclosure. In FIG. 4A, the substrate 110 is provided and may be a flexible substrate. The material of the substrate 110, for example, is organic polymer. For instance, the material is polyimide (PI), polycarbonate (PC), polyethersulfone (PES), polynorbornene (PNB), polyetherimide (PEI), poly(p-phenylene benzobisimidazole) (PBI), p-phenylene benzobisoxazole (PBO), poly(p-phenylene terephthalamide) (PPTA), other suitable material or the composition thereof.

In order to improve the process efficiency, the flexible substrate 110 may be adhered on a carrier 101 in advance. There is a release layer (not shown) between the substrate 110 and the carrier 101. After the process is completed, the release layer helps to separate the substrate 110 and the carrier 101. The material of the carrier may be a hard material, for example, glass, Acrylics, polymethyl methacrylate (PMMA), polyethylene terephthalate (PET) and so on.

In FIG. 4A, a barrier layer 112 is formed on the substrate 110. The barrier layer 112 may be a composite layer composed of multiple inorganic layers and organic dielectric materials. The barrier layer 112 covers the substrate 110. The material of the barrier layer 112 may be an inorganic dielectric material which may isolate oxygen and moisture, for example, silicon nitride, silicon oxide, silicon oxynitride or the composition thereof. The thickness of the barrier layer 112 may be about 10 to 1000 nanometers. The forming method of the barrier layer 112 may be, for example, Chemical Vapor Deposition (CVD).

In FIG. 4B, the gate electrode 122 is formed on the substrate 110. In practice, a first conductive layer (not shown) is formed on the barrier layer 112, and then the first conductive layer is patterned to form the gate electrode 122 and the bottom metal layer 123. The gate electrode 122 and the bottom metal layer 123 are separated by a distance.

The material of the first conductive layer (that is, the gate electrode 122 and the bottom metal layer 123) may be titanium, molybdenum, chromium, iridium, aluminum, copper, silver, gold, the composition thereof, or alloy thereof. The thickness of the first conductive layer may be about 10 to 500 nanometers. The forming method of the first conductive layer may be Physical Vapor Deposition (PVD), for example, sputtering. The patterning method of the first conductive layer includes photolithography and etching processes.

In FIG. 4C, the gate dielectric layer 124 is formed on the gate electrode 122 and the bottom metal layer 123. The gate dielectric layer 124 further covers the barrier layer 112 exposed by the gate electrode 122 and the bottom metal layer 123. The material of the dielectric layer 124 may be a suitable dielectric material, for example, silicon nitride, silicon oxide, silicon oxynitride or the composition thereof. The thickness of the dielectric layer 124 may be about 100 to 1000 nanometers. The forming method of the dielectric layer 124 may be, for example, Chemical Vapor Deposition (CVD).

In FIG. 4C, the channel layer 126 is formed on the gate dielectric layer 124 and the channel layer 126 is located over the gate electrode 122. In practice, a semiconductor layer (not shown) is formed over the gate dielectric layer 124 first, and then the semiconductor layer is patterned to form the channel layer 126.

The material of the semiconductor layer (that is, the channel layer 126) may be any semiconductor material, for example, amorphous silicon, poly silicon, single crystal silicon, oxide semiconductor, or the composition thereof. The thickness of the semiconductor layer may be about 10 to 500 nanometers. The forming method of the semiconductor layer may be, for example, Chemical Vapor Deposition (CVD). The patterning method of the semiconductor layer may be, for example, photolithography and etching processes.

As shown in FIG. 4D, the source electrode 128 and the drain electrode 130 are formed on the opposite sides of the channel layer 126. In practice, a second conductive layer (not shown) is formed over the channel layer 126 and the gate dielectric layer 124 first, and then the second conductive layer is patterned to form the source electrode 128, the drain electrode 130 and the first metal electrode 141. The first metal electrode 141 is over the gate dielectric layer 124 on the bottom metal layer 123.

The material of the second conductive layer (that is, the source electrode 128, the drain electrode 130 and the first metal electrode 141) may be titanium, molybdenum, chromium, iridium, aluminum, copper, silver, gold, the composition thereof, or alloy thereof. The thickness of the second conductive layer may be about 10 to 500 nanometers. The forming method of the second conductive layer may be Physical Vapor Deposition (PVD), for example, sputtering. The patterning method of the second conductive layer may be, for example, photolithography and etching processes.

After the steps above are completed, the gate electrode 122, the gate dielectric layer 124, the channel layer 126, the source electrode 128 and the drain electrode 130 form the thin film transistor 120.

In FIG. 4E, the passivation layer 150 is formed over the substrate 110. The passivation layer 150 covers the gate dielectric layer 124 and the thin film transistor 102. The passivation layer 150 over the bottom metal layer 123 may further form the opening 150 so that the portion of the first metal electrode 141 is exposed to define the position the optical sensing layer 142 (shown in FIG. 2).

The material of the passivation layer 150 may be an inorganic dielectric material, for example, silicon nitride, silicon oxide, silicon oxynitride or the composition thereof. The thickness of the passivation layer 150 may be about 100 to 1000 nanometers. The forming method of the passivation layer 150 may be, for example, Chemical Vapor Deposition (CVD). The method to form the opening 152 in the passivation layer 150 may be, for example, photolithography and etching processes.

In FIG. 4F, the optical sensing layer 142 is formed in the opening 152 and on the first metal electrode 141. The optical sensing layer 142 is connected to the first metal electrode 141 directly. The method for forming the optical sensing layer 142 includes forming an optical sensing dielectric layer (not shown) on the passivation layer 150 and patterning the optical sensing dielectric layer to define the optical sensing layer 142 on the first metal electrode 141. The optical sensing layer 142 is filled in the opening 152 and contacts the first metal electrode 141.

The material of the optical sensing dielectric layer (that is, the optical sensing layer 142) may be silicon rich oxide (SRO), silicon rich nitride (SRN) or silicon rich carbide (SRC). The thickness of the optical sensing layer 142 may be about 100 to 1000 nanometers.

Figure 4G:
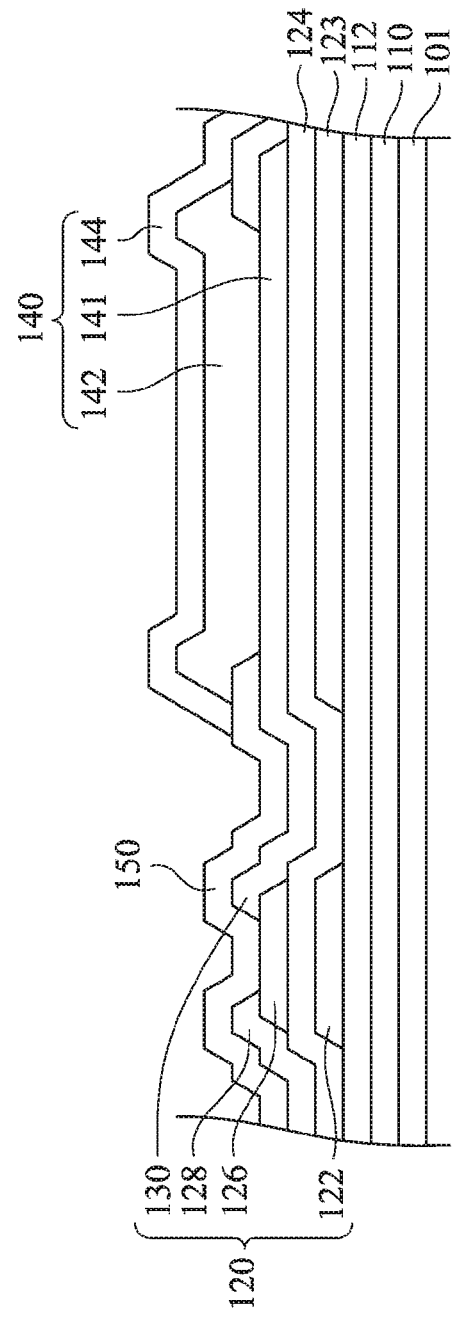

As shown in FIG. 4G, the first transparent electrode 144 is formed on the optical sensing layer 142. The fabricating steps include forming a first transparent conductive layer (not shown) over the optical sensing layer 142, patterning the first transparent conductive layer to form the first transparent electrode 144. The first transparent electrode 144 may be coupled to a predetermined potential. As shown in FIG. 2, the first transparent electrode 144 is coupled to a common potential (Vcom) of the bottom metal layer 123 through the opening 151 so that an external electric field is applied to the optical sensing layer 142. Accordingly, the first metal electrode 141, the optical sensing layer 142 and the first transparent electrode 144 form the optical sensor 140. The first metal electrode 141 is connected to the drain electrode 130 of the thin film transistor 120.

The material of the first transparent conductive layer (that is, the first transparent electrode 144) may be any suitable transparent conductive material, for example, indium tin oxide (ITO), indium zinc oxide (IZO), zinc aluminum oxide (ZAO), other conductive oxide or the composition thereof. The thickness of the first transparent conductive layer may be about 10 to 500 nanometers. The forming method of the first transparent conductive layer may be, for example, Physical Vapor Deposition (PVD) or Chemical Vapor Deposition (CVD). The patterning method of the first transparent conductive layer includes photolithography and etching processes.

Figure 4H:
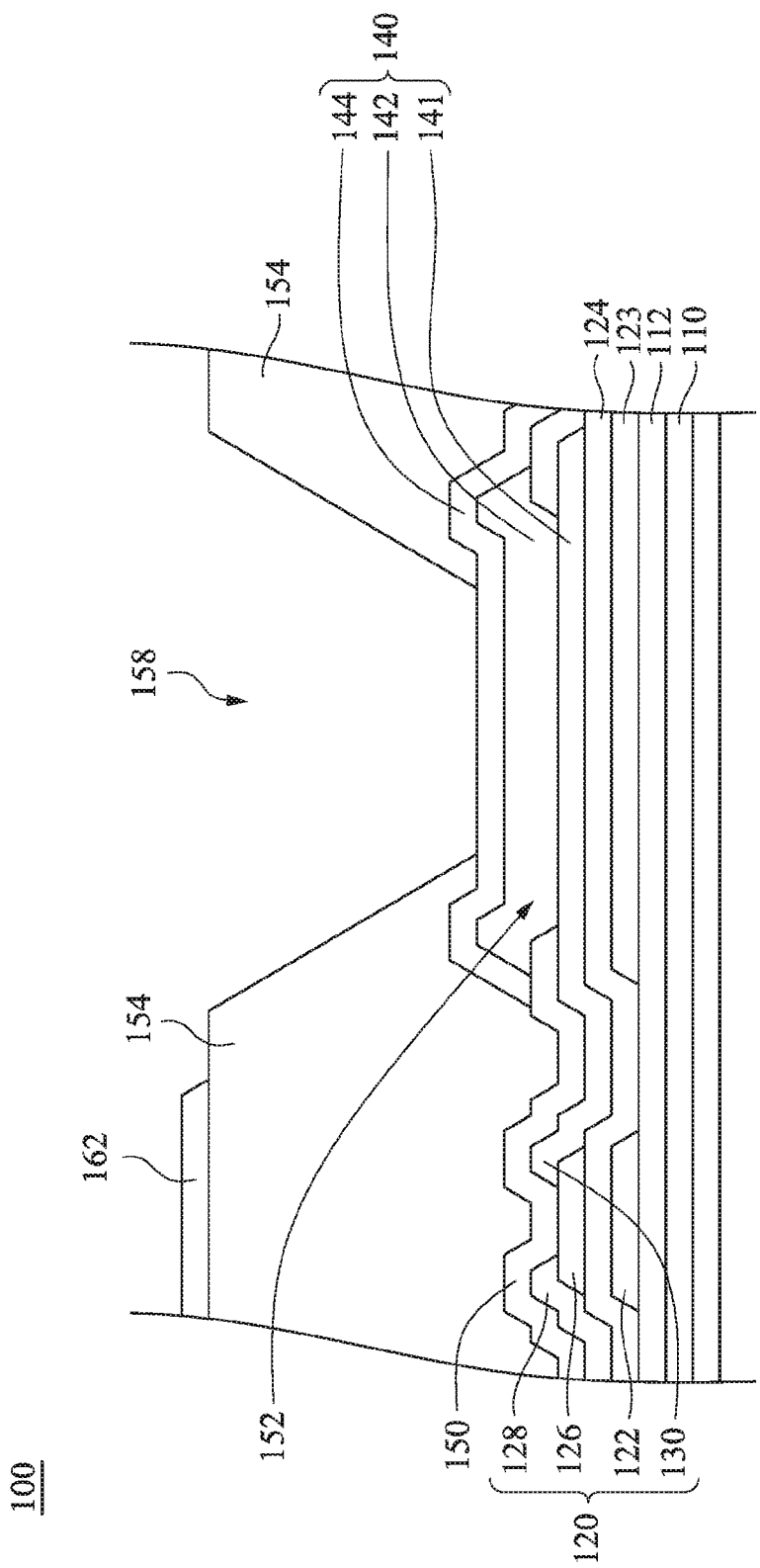

As shown in FIG. 4H, the planar layer 154 is formed over the substrate 110. The planar layer 154 covers the thin film transistor 120 and the optical sensor 140. The planar layer 154 is patterned to form the opening 158 so that portion of the first transparent electrode 144 is exposed. In this embodiment, the planar layer 154 covers the passivation layer 150, but this disclosure should not limited to this structure. There may have other layers, for example, other dielectric layer or barrier layer, over the thin film transistor 120 or the passivation layer 150 so that the planar layer 154 may cover these layers. In other words, the planar layer 154 may cover the passivation layer 150 directly or indirectly.

The material of the planar layer 154 may be any suitable organic dielectric material, for example, acrylic polymer. The thickness of the planar layer 154 may be about 3 micrometers. The forming method of the planar layer 154 may be, for example, spin coating. The patterning method of the planar layer 154 includes dry etching or wet etching process.

In FIG. 4H, the second metal electrode 162 is formed over the planar layer 154. In practice, a third conductive layer (not shown) is formed over the planar layer 154 first. Then, the third conductive layer is patterned to form the second metal electrode 162. The second metal electrode 162 is over the thin film transistor 120. The orthogonal project of the second metal electrode 162 is at least partially overlapped with that of the channel layer 126 on the substrate 110 so that the second metal electrode 162 provides the shade effect to the channel layer 126.

The third conductive layer (that is, the second metal electrode 162) has a multiple conductive layer structure. The material of the third conductive layer may be titanium, molybdenum, chromium, iridium, aluminum, copper, silver, gold, the composition thereof, or alloy thereof. The thickness of the third conductive layer may be about 100 to 300 nanometers. The forming method of the third conductive layer may be Physical Vapor Deposition (PVD), for example, sputtering. The patterning method of the third conductive layer includes photolithography and etching processes.

Figure 4I:
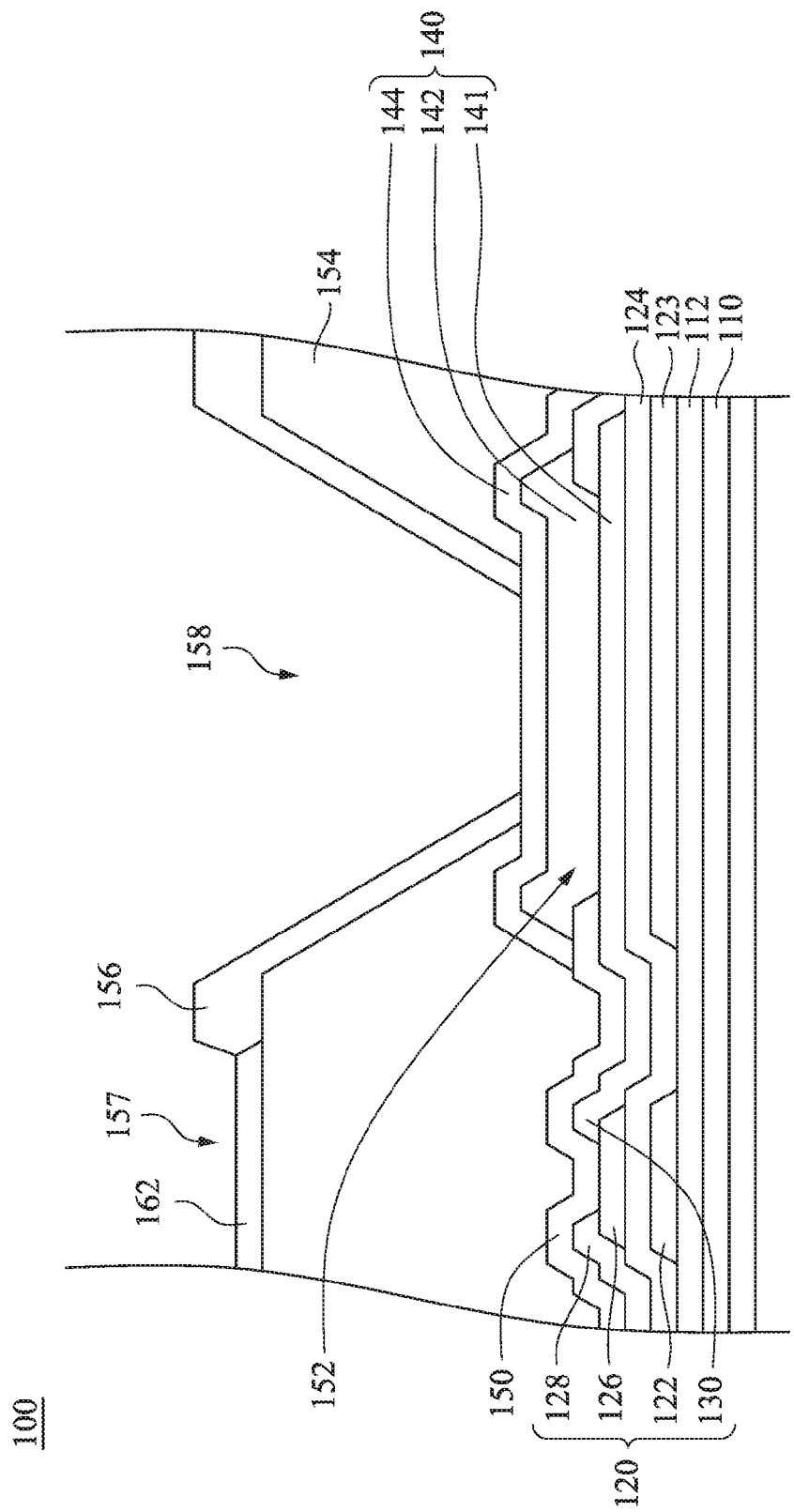

As shown in FIG. 4I, the dielectric layer 156 is formed over the substrate 110. The dielectric layer 156 covers the planar layer 154. Further, the dielectric layer 156 is patterned so that an opening 157 exposes the second metal electrode 162 and the opening 158 exposes portion of the first transparent electrode 144. The height of the dielectric layer 156 is higher than that of the second metal electrode 162. Accordingly, the position of the organic electroluminescent layer formed thereafter is defined by the opening 157 of the dielectric layer 156.

The material of the dielectric layer 156 may be a suitable organic dielectric material, for example, acrylic polymer. The forming method of the dielectric layer 156 may be, for example, spin coating. The patterning method of the dielectric layer 156 includes dry etching or wet etching process.

Figure 4J:
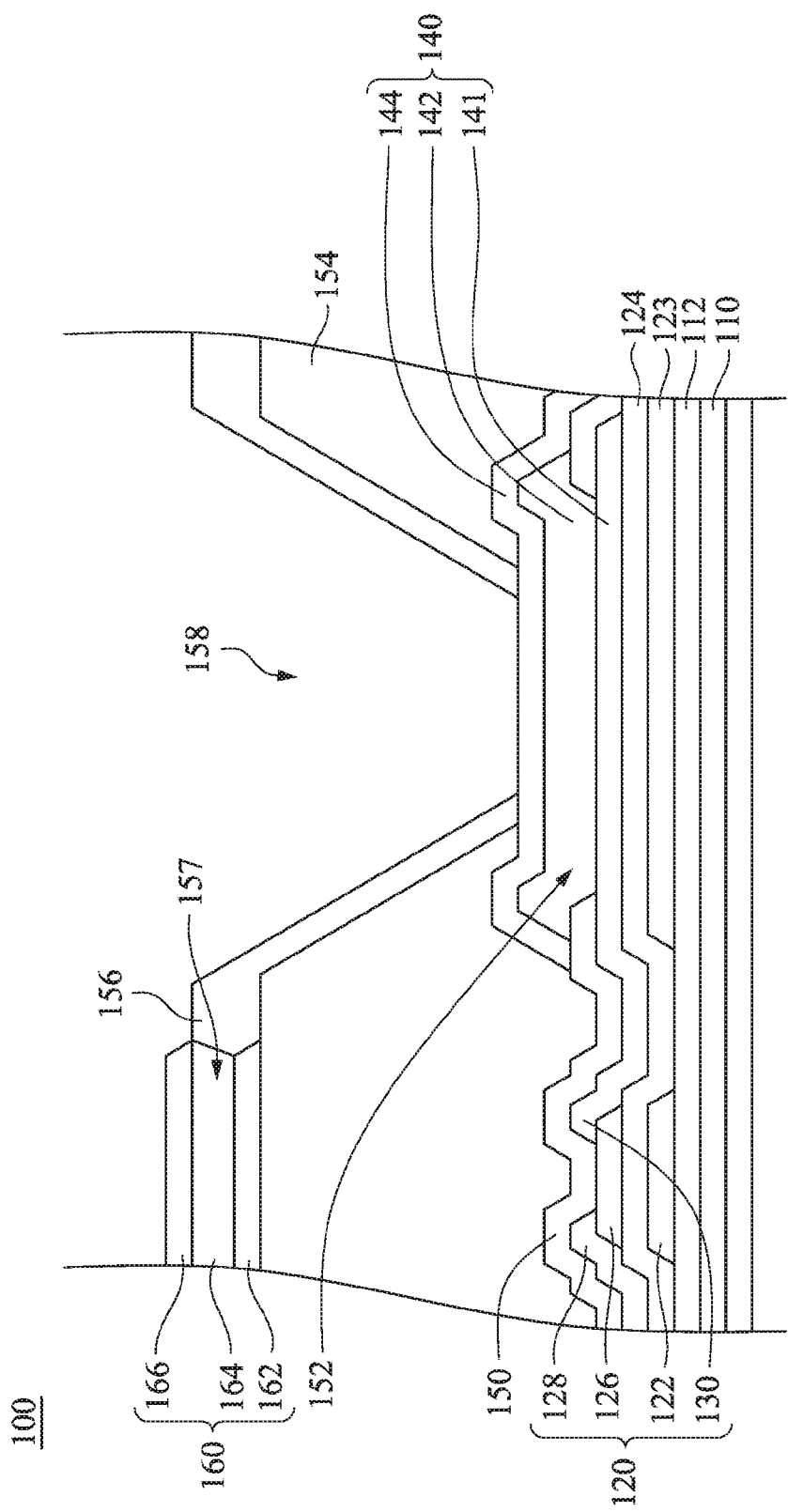

In FIG. 4J, the organic electroluminescent layer 164 is formed in the opening 157 of the dielectric layer 156. The organic electroluminescent layer 164 may have a single layer structure or a multiple layer structure. For example, a hole inject layer, a hole transport layer, organic electroluminescent material, an electron transport layer and an electron inject layer may be formed in the opening 157 in sequence. The organic electroluminescent layer 164 may be formed by, for example, vacuum evaporation.

In FIG. 4J, the second transparent electrode 166 is formed over the organic electroluminescent layer 164. The second transparent electrode 166, the organic electroluminescent layer 164 and the second metal electrode 162 collectively form the organic light emitting diode 160. The second transparent electrode 166 is utilized as the cathode of the organic light emitting diode 160, while the second metal electrode 162 is utilized as the anode of the organic light emitting diode 160.

The forming method of the second transparent electrode 166 includes forming a second transparent conductive layer (nor shown) over the substrate 110 and patterning the second transparent conductive layer to form the second transparent electrode 166.

The second transparent conductive layer (that is, the second transparent electrode 166) has a multiple layer structure. The material thereof may be a composition of metal or alloy, for example, magnesium, silver, aluminum, indium, lithium, the alloy thereof or the composition thereof.

The multiple layer structure of the transparent conductive layer may be, for example, composed of aluminum and magnesium. The thickness of the second transparent conductive layer may be about 10 to 100 nanometers. The forming method of the second transparent conductive layer may be, for example, Physical Vapor Deposition (PVD) or Chemical Vapor Deposition (CVD). The patterning method of the second transparent conductive layer includes photolithography and etching processes.

Figure 4K:
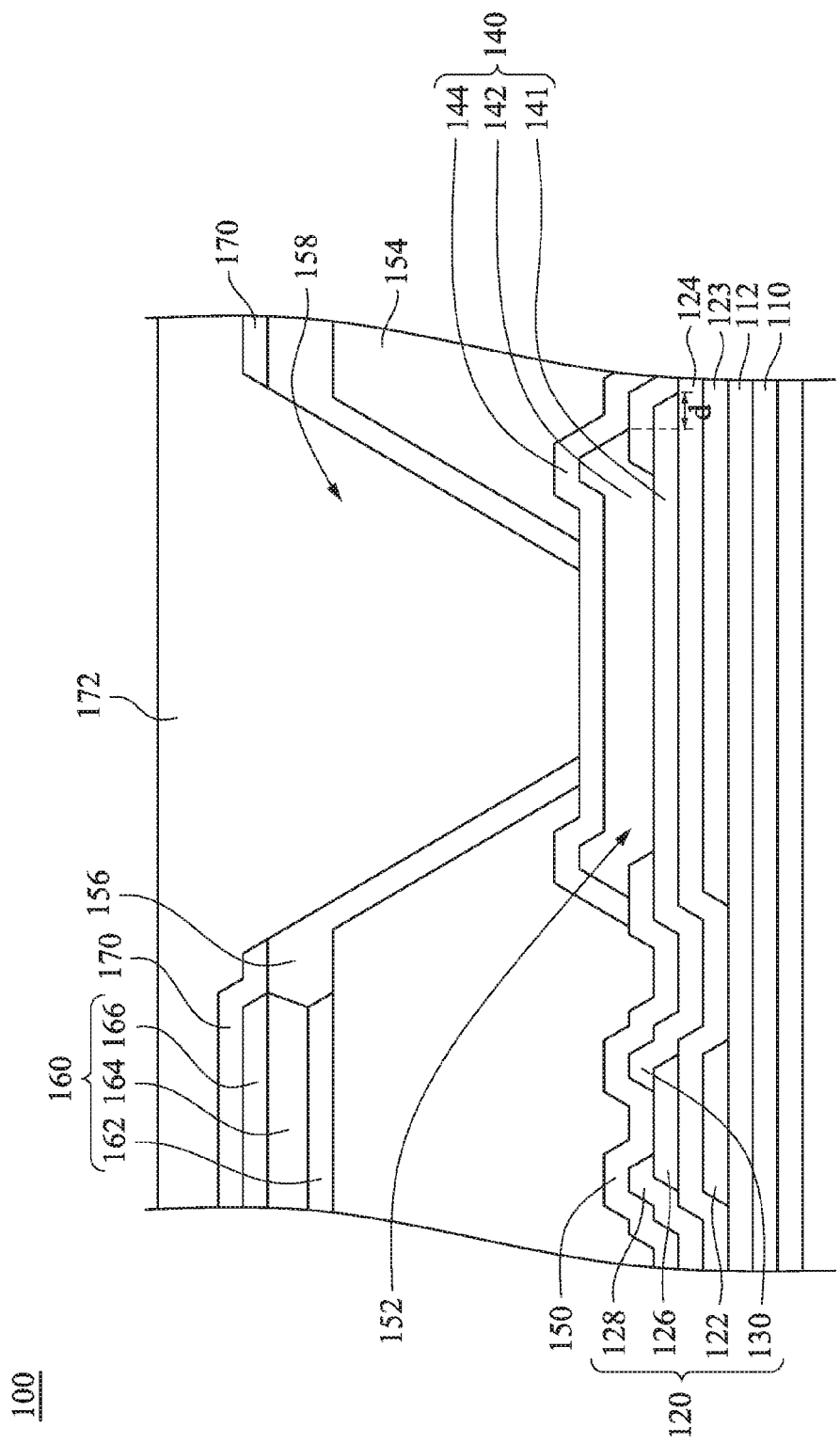

As shown in FIG. 4K, the barrier layer 170 is formed over the substrate 110 and covers the organic light emitting diode 160. The barrier layer 170 has an opening communicating to the opening 158 to uncover the optical sensor 140. The protection layer 172 is formed over the barrier layer 170 and covers the organic light emitting diode 160 and the optical sensor 140. The material of the barrier layer 170 may be an inorganic dielectric material which may isolate oxygen and moisture, for example, silicon nitride, silicon oxide, silicon oxynitride or the composition thereof. The thickness of the barrier layer 170 may be about 1000 to 5000 nanometers. The forming method of the barrier layer 170 may be, for example, Chemical Vapor Deposition (CVD). The patterning method of the barrier layer 170 includes photolithography and etching processes.

The material of the protection layer 172 may be an organic dielectric material, for example, acrylic polymer. The thickness of the protection layer 172 may be about 1 to 5 micrometers. The forming method of the protection layer 172 may be, for example, spin coating. The protection layer 172 is filled in the opening 158. Otherwise, the material of the protection layer 172 may be an inorganic material.

Figure 5:
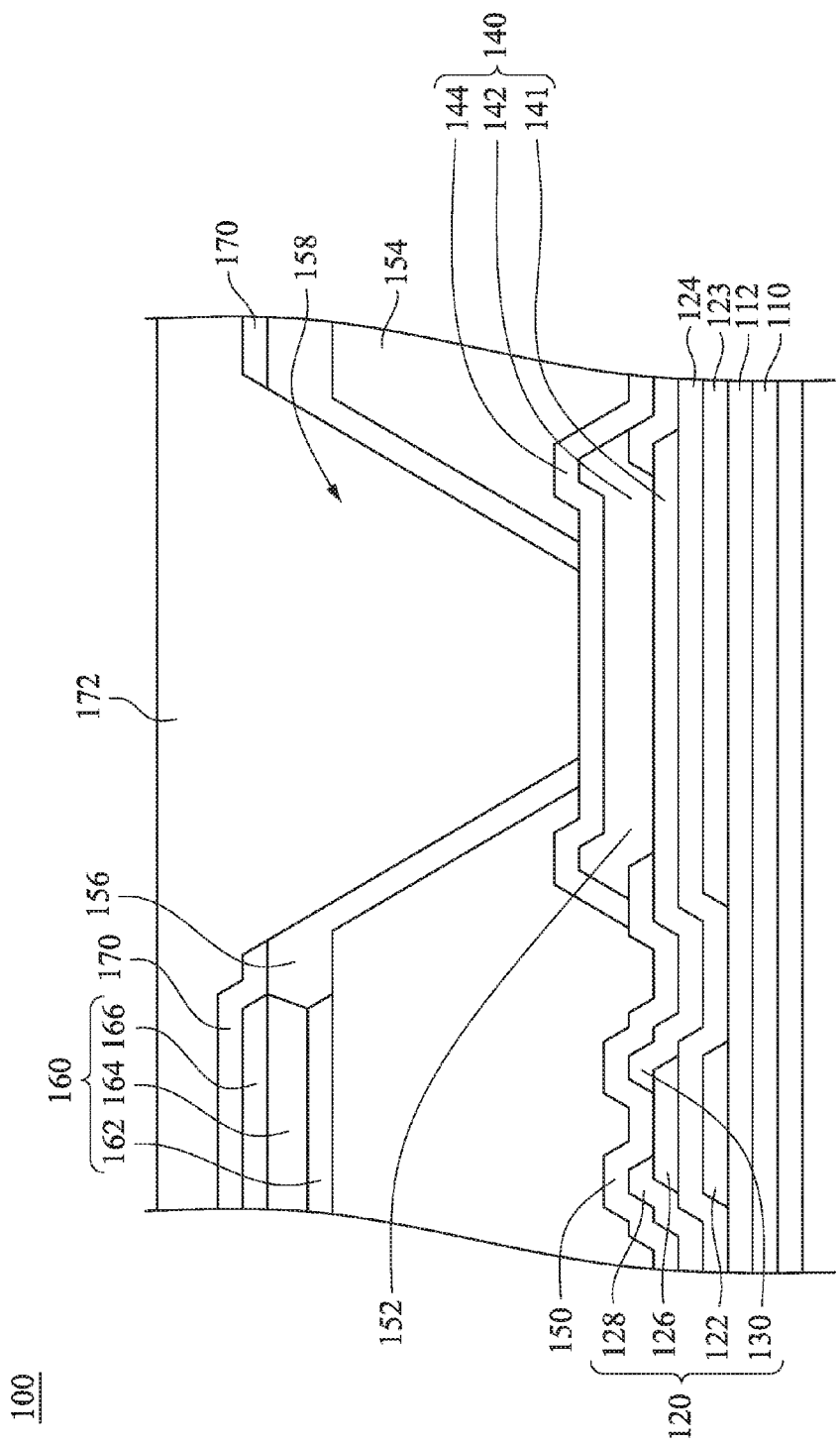
FIG. 5 and FIG. 6 are schematic cross-sectional views of the optical sensing device according to different embodiments of this disclosure.
Figure 6:
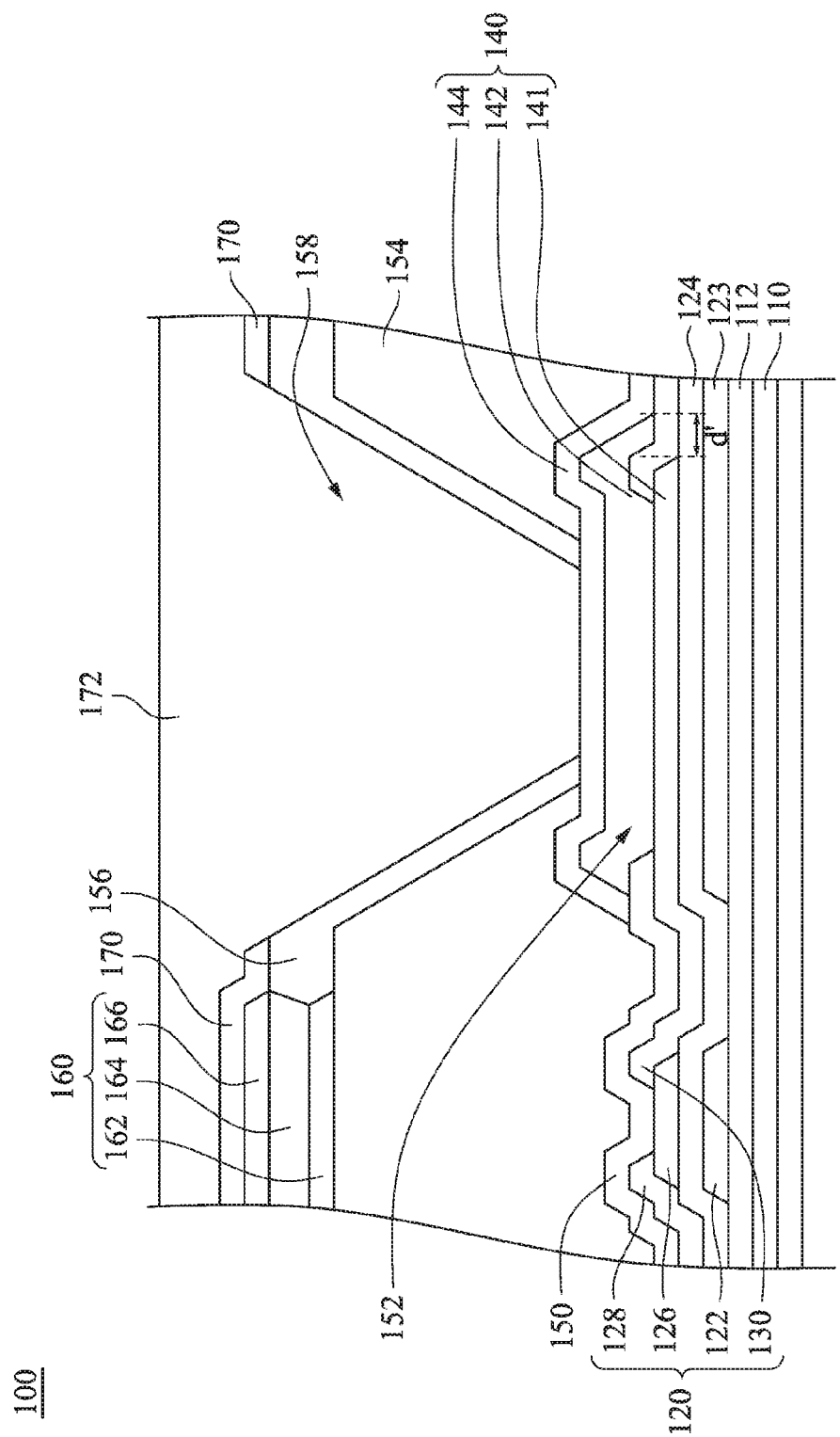

After the process above, the optical sensing device 100 as shown in FIG. 1 is produced. Because the second metal electrode 162 may provide shade function to block the light entering the thin film transistor 120, the optical sensing device 100 makes maximum utilization of space. Therefore, the optical sensing layer 142 has larger sensing area. For example, as shown in FIG. 4K, the edge of the optical sensing layer 142 may shrink a distance d from the edge of the first metal electrode 141. The distance d is smaller than 1.5 micrometers. Otherwise, in other embodiment, the edge of the optical sensing layer 142 may be aligned with that of the first metal electrode 141, as shown in FIG. 5. Moreover, the edge of the optical sensing layer 142 may be protruded a distance d' from that of the first metal electrode 141, as shown in FIG. 6.

Figure 7:
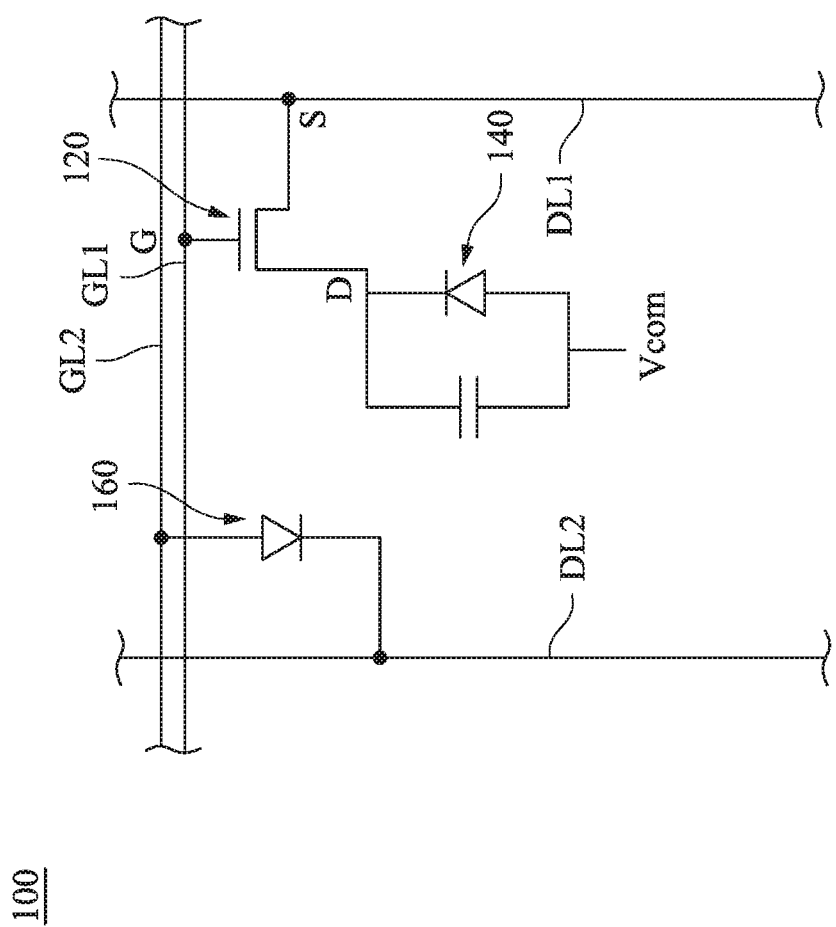
FIG. 7 is a schematic circuit diagram of the optical sensing device according to some embodiments of this disclosure.

Referring to FIG. 7, FIG. 7 is a schematic circuit diagram of the optical sensing device according to some embodiments of this disclosure. The optical sensing device 100 includes the thin film transistor 120, the optical sensor 140, the organic light emitting diode 160, two gate lines GL1, GL2 and two data lines DL1, DL2. The gate electrode G of the thin film transistor 120 is electrically coupled to the gate line GL1. The drain electrode D of the thin film transistor 120 is electrically coupled to the optical sensor 140. The source electrode S of the thin film transistor 120 is electrically coupled to the data line DL1. The passive organic light emitting diode 160 is electrically coupled to the gate line GL2, the data line DL2 and the power supply (not shown). When the power supply is turned on and a voltage is applied to the anode (for common cathode type) or the cathode (for common anode type) of the organic light emitting diode 160, the organic light emitting diode 160 is actuated to emit light. It is not needed to add any active component to control the organic light emitting diode 160. In practice, the number of the organic light emitting diode 160 is more than one. The organic light emitting diodes 160 are electrically coupled to the power supply so that the power supply may drive the organic light emitting diodes 160 to emit light.

When the optical sensor detects the light, the optical sensor 140 generates the light current and the light current is transmitted to the thin film transistor 120 through the drain electrode D. After the light current is transmitted to the source electrode S of the thin film transistor 120 through the channel layer, the light current is transmitted to the data line DL1 and received by a controller (not shown).

To sum up, this disclosure provides an optical sensing device which utilizes an organic light emitting diode as a light source. When a finger puts on the optical sensing device, the light reflected by the finger and received by the optical sensor is transformed into a light current. The light current is detected by the thin film transistor respectively. Because the second metal electrode of the organic light emitting diode may provide the shade function to the channel layer, the process for fabricating the shading component may be omitted. Meanwhile, the photosensitive area of the optical sensing device is increased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A fabricating method of an optical sensing device comprising:
    forming a gate electrode on a substrate;
    forming a gate dielectric layer on the gate electrode;
    forming a channel layer on the gate dielectric layer;
    forming a metal layer on the channel layer and patterning the metal layer, so that the patterned metal layer forms a source electrode, a drain electrode and a first metal electrode, wherein the source electrode and the drain electrode are located on the opposite sides of the channel layer, wherein the first metal electrode is connected to the drain electrode and wherein the gate electrode, the gate dielectric layer, the channel layer, the source electrode and the drain electrode collectively form a thin film transistor;
    forming an optical sensing layer on the first metal electrode;
    forming a first transparent layer on the optical sensing layer;
    forming a planar layer covering at least a portion of the thin film transistor and the first transparent layer; and
    forming an organic light emitting diode on the planar layer, comprising:
        forming a second metal electrode on the planar layer;
        forming an organic electroluminescent layer on the second metal electrode; and
        forming a second transparent layer on the organic electroluminescent layer.

2. The fabricating method of claim 1, wherein the material of the optical sensing layer is silicon rich oxide, silicon rich nitride or silicon rich carbide.

3. The fabricating method of claim 1, wherein the substrate is a flexible substrate.

4. The fabricating method of claim 1, wherein the orthogonal project of the organic light emitting diode does not overlap that of the optical sensor on the substrate.

* * * * *